(12) United States Patent
Horn et al.

(10) Patent No.: US 9,559,491 B2
(45) Date of Patent: Jan. 31, 2017

(54) LASER DIODE WITH COOLING ALONG EVEN THE SIDE SURFACES

(71) Applicant: OSRAM Opto Semiconductors GmbH, Regensburg (DE)

(72) Inventors: Markus Horn, Straubing (DE); Bernhard Stojetz, Wiesent (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/910,813

(22) PCT Filed: Aug. 14, 2014

(86) PCT No.: PCT/EP2014/067436
§ 371 (c)(1),
(2) Date: Feb. 8, 2016

(87) PCT Pub. No.: WO2015/024860
PCT Pub. Date: Feb. 26, 2015

(65) Prior Publication Data
US 2016/0204575 A1    Jul. 14, 2016

(30) Foreign Application Priority Data

Aug. 21, 2013 (DE) .................. 10 2013 216 526

(51) Int. Cl.
*H01S 3/04* (2006.01)
*H01S 5/024* (2006.01)
(Continued)

(52) U.S. Cl.
CPC .......... *H01S 5/02469* (2013.01); *H01S 5/024* (2013.01); *H01S 5/02272* (2013.01);
(Continued)

(58) Field of Classification Search
CPC .............. H01S 5/02469; H01S 5/02248; H01S 5/02272; H01S 5/02476; H01S 5/024; H01S 5/4031
(Continued)

(56) References Cited

U.S. PATENT DOCUMENTS

| 5,454,002 A | 9/1995 | McCann |
| 5,521,931 A * | 5/1996 | Biegelsen ........... H01S 5/02252 372/36 |

(Continued)

FOREIGN PATENT DOCUMENTS

| DE | 10 2009 040 834 A1 | 5/2011 |
| JP | 59-151484 A | 8/1984 |

(Continued)

*Primary Examiner* — Kinam Park
(74) *Attorney, Agent, or Firm* — DLA Piper LLP (US)

(57) ABSTRACT

A laser component includes a laser chip having a top side, an underside, a first side surface and a second side surface, which are oriented parallel to a resonator of the laser chip, wherein an underside of the laser chip is arranged in a manner bearing on a carrier, a top side of the laser chip is arranged in a manner bearing on a further carrier, the laser chip is hermetically tightly encapsulated between the carrier and the further carrier, a second electrical contact pad of the laser chip, said second electrical contact pad being formed on the top side of the laser chip, electrically conductively connects to a second electrical mating contact pad formed on the further carrier, and the first side surface of the laser chip thermally conductively connects to a heat sink.

16 Claims, 6 Drawing Sheets

(51) Int. Cl.
*H01S 5/022* (2006.01)
*H01S 5/40* (2006.01)

(52) U.S. Cl.
CPC ......... *H01S 5/0222* (2013.01); *H01S 5/02248* (2013.01); *H01S 5/02476* (2013.01); *H01S 5/4018* (2013.01); *H01S 5/4031* (2013.01)

(58) Field of Classification Search
USPC .................................................... 372/36, 34
See application file for complete search history.

(56) References Cited

U.S. PATENT DOCUMENTS

| | | | | |
|---|---|---|---|---|
| 5,872,881 | A * | 2/1999 | Rossi | G02B 6/4248 385/92 |
| 7,526,009 | B2 * | 4/2009 | Lee | H01S 5/024 372/34 |
| 8,340,144 | B1 * | 12/2012 | Grove | H01S 5/02264 372/34 |
| 2011/0134948 | A1 * | 6/2011 | Kawakami | B82Y 20/00 372/34 |
| 2013/0058367 | A1 | 3/2013 | Grove | |

FOREIGN PATENT DOCUMENTS

| | | |
|---|---|---|
| JP | 63-217648 A | 9/1988 |
| JP | 2005-044831 A | 2/2005 |
| JP | 2005-044829 A | 2/2006 |
| JP | 2011-119521 A | 6/2011 |

\* cited by examiner

LASER DIODE WITH COOLING ALONG EVEN THE SIDE SURFACES

TECHNICAL FIELD

This disclosure relates to a laser component.

BACKGROUND

Laser components comprising semiconductor-based laser chips are known. During their operation, semiconductor-based laser chips generate waste heat that must be dissipated to prevent overheating and associated damage or destruction of the laser chips. It is known to arrange laser chips with their underside on carriers having good thermal conductivity to enable heat dissipation. It is likewise known to arrange a laser chip upside down on a carrier such that a top side of the laser chip faces the carrier. A further known possibility for the thermal coupling of laser chips consists of arranging a laser chip with its underside on a carrier and thermally contacting the top side of the laser chip by a metal strip or a metal clip.

It could nonetheless be helpful to provide an improved laser component.

SUMMARY

We provide a laser component including a laser chip having a top side, an underside, a first side surface and a second side surface, which are oriented parallel to a resonator of the laser chip, wherein an underside of the laser chip is arranged in a manner bearing on a carrier, a top side of the laser chip is arranged in a manner bearing on a further carrier, the laser chip is hermetically tightly encapsulated between the carrier and the further carrier, a second electrical contact pad of the laser chip, the second electrical contact pad being formed on the top side of the laser chip, electrically conductively connects to a second electrical mating contact pad formed on the further carrier, and the first side surface of the laser chip thermally conductively connects to a heat sink.

LIST OF REFERENCE SIGNS

Figure 1:
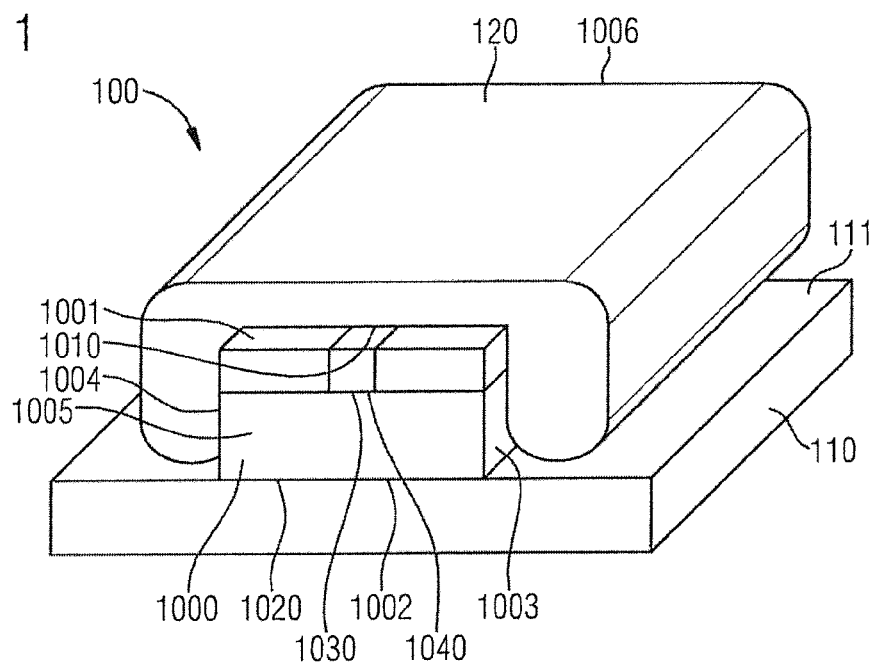
FIG. 1 shows a first laser component.

100 First laser component
110 First carrier
111 Top side
120 First heat sink
200 Second laser component
210 Second carrier
211 Top side
220 Second heat sink
221 First parallelepiped
222 Second parallelepiped
223 Soft solder
300 Third laser component
310 Third carrier
311 Top side
320 Third heat sink
330 Depression
331 Bottom
332 First side wall
333 Second side wall
334 Depth
340 Filling material
341 Height
400 Fourth laser component
410 Fourth carrier
411 Top side
420 Fourth heat sink
430 Metallization
431 Thickness
440 Cutout
500 Fifth laser component
510 Fifth carrier
511 Top side
512 Insulating material
513 Conducive material
520 Fifth heat sink
530 Depression
531 Bottom
532 First side wall
533 Second side wall
534 Depth
600 Sixth laser component
610 Sixth carrier
611 Top side
620 Sixth heat sink
630 First soldering contact pad
635 First mating contact pad
640 Further carrier
641 Top side
650 Second soldering contact pad
655 Second mating contact pad
700 Seventh laser component
710 Seventh carrier
711 Top side
720 Seventh heat sink
730 First soldering contact pad
735 First mating contact pad
740 Further carrier
741 Top side
750 Second soldering contact pad
755 Second mating contact pad
760 Spacer
770 Front cover glass
775 Optical lens
780 Rear cover glass
800 Eighth laser component
810 Eighth carrier
811 Top side
820 Eighth heat sink
830 First soldering contact pad
835 First mating contact pad
840 Further carrier
841 Top side
850 Second soldering contact pad
855 Second mating contact pad
860 Spacer
870 Front cover glass
875 Optical lens
880 Rear cover glass
890 Further laser chip 1000 Laser chip
1001 Top side
1002 Underside
1003 First side surface
1004 Second side surface
1005 First end side
1006 Second end side
1010 First electrical contact pad
1020 Second electrical contact pad
1030 Resonator
1040 Emission region

DETAILED DESCRIPTION

Our laser component comprises a laser chip having a top side, an underside, a first side surface and a second side surface oriented parallel to a resonator of the laser chip. The first side surface of the laser chip thermally conductively connects to a heat sink. Advantageously, in this laser component, waste heat can be dissipated via the first side surface of the laser component. In addition, heat can also be dissipated via the underside, the top side and/or the second side surface of the laser chip of the laser component. This advantageously makes it possible to dissipate a large amount of heat from the laser chip of the laser component. This enables the laser chip of the laser component to be operated with high optical output power, without fear of overheating the laser chip of the laser component.

The laser chip of the laser component can have a p-doped region of the laser chip adjacent to the surface of the laser chip and an n-doped region of the laser chip adjacent to the underside of the laser chip. An active region of the laser chip can be arranged nearer to the top side than to the underside of the laser chip.

The underside of the laser chip may be arranged in a manner bearing on a carrier. Advantageously, waste heat produced in the laser chip of the laser component can then also flow away into the carrier via the underside of the laser chip. Advantageously, a particularly large amount of heat can be dissipated from the laser chip as a result. This enables the laser chip of the laser component to be operated with high optical output power.

A first electrical contact pad of the laser chip, the first electrical contact pad being formed on the underside of the laser chip, may electrically conductively connect to a first electrical mating contact pad formed on the carrier. Advantageously, electrical current and electrical voltage can be applied to the laser chip of the laser component via the first electrical mating contact pad.

A second electrical contact pad of the laser chip, the second electrical contact pad being formed on the top side of the laser chip, may electrically conductively connect to a second mating contact pad by a bond wire. Advantageously, electrical voltage and electrical current can be applied to the laser chip of the laser component via the second mating contact pad and the bond wire.

The top side of the laser chip may be arranged to bear on a further carrier. In this case, a second electrical contact pad of the laser chip, the second electrical contact pad being formed on the top side of the laser chip, electrically conductively connects to a second electrical mating contact pad formed on the further carrier. Advantageously, electrical voltage and electrical current can be applied to the laser component via the second electrical mating contact pad.

A respective soldering contact pad to electrically contact the laser component may be arranged on the carrier and the further carrier. The soldering contact pads of the laser component can apply an electrical voltage to the laser component to operate the laser chip of the laser component. The soldering contact pads suitably electrically contact the laser component. The laser component can be a surface-mountable component (SMT component). In this case, the soldering contact pads of the laser component can be electrically contacted by reflow soldering, for example.

The laser chip may be hermetically tightly encapsulated between the carrier and the further carrier. Advantageously, the laser chip of the laser component is thereby protected against damage as a result of external mechanical effects. In particular, the laser chip of the laser component is advantageously protected against dust and moisture. As a result, the laser component can advantageously have a particularly long lifetime.

The laser component may comprise a cover glass arranged in front of a radiation emission face of the laser chip. The cover glass can be transparent to a laser beam emitted by the laser chip of the laser component. As a result, a laser beam emitted by the laser chip of the laser component can emerge from the housing of the laser component through the cover glass.

The cover glass may comprise an integrated optical lens. The lens can, for example, expand or collimate a laser beam emitted by the laser chip of the laser component. Integration of the optical lens into the cover glass of the laser component advantageously obviates the need to provide an additional optical lens.

The laser component may comprise a further laser chip. Advantageously, the laser component can have a particularly high optical output power as a result. Since the laser chip of the laser component thermally conductively connects to a heat sink via its first side surface, the laser chip and the further laser chip of the laser component can advantageously be arranged spatially close together, without needing to fear overheating of the laser chip and/or of the further laser chip.

The heat sink may comprise an electrically insulating material that bears on at least one part of the first side surface of the laser chip. Advantageously, waste heat produced in the laser chip of the laser component can thereby flow away into the heat sink of the laser component, the heat sink comprising the electrically insulating material. Since the heat sink is electrically insulating, there is advantageously no risk of a short circuit caused by the heat sink.

The electrically insulating material may comprise aluminum nitride (AlN). Advantageously, the electrically insulating material of the heat sink of the laser component thereby has a high electrical insulation capability and a high thermal conductivity.

The electrically insulating material may be in the form of granules. This advantageously enables particularly simple production of the laser component. In this case, the electrically insulating material can be arranged in a desired form and in a desired amount on or around the laser chip of the laser component. In this case, the electrically insulating material can be present in the form of a paste, for example. After the electrically insulating material has been arranged, it can be hardened to increase a mechanical stability of the laser component.

The electrically insulating material may also bear on at least one part of the second side surface and one part of the top side of the laser chip. Advantageously, via the second side surface and the top surface, too, waste heat from the laser chip of the laser component can then flow away into the heat sink comprising the electrically insulating material. Particularly effective dissipation of waste heat from the laser chip of the laser component is made possible as a result. This enables the laser chip of the laser component to be operated at high power.

The heat sink may be fixed to the first side surface by a soft solder. Advantageously, the laser component can be produced in a particularly simple manner as a result.

A depression may be formed on a top side of the carrier. In this case, the underside of the laser chip is arranged on the base of the depression. A region of the depression that surrounds the laser chip is at least partly filled with a filling material. Advantageously, waste heat produced in the laser chip of the laser component can flow away via the first side surface of the laser chip and the filling material arranged in the depression into a side wall of the depression.

The filling material may comprise a solder, aluminum nitride (AlN) or Cu. Advantageously, these filling materials can be arranged in a simple manner in that region of the depression surrounding the laser chip, and have a high thermal conductivity and a low thermal resistance.

The depression may have a depth of 10 µm to 200 µm. Preferably, the depression has a depth of 30 µm to 70 µm. In this case, the filling material above the base of the depression has a height of 10 µm to 150 µm. Preferably, the filling material above the base of the depression has a height of 10 µm to 70 µm. We found that a filling of that region of the depression surrounding the laser chip on the top side of the carrier enables effective dissipation of waste heat from the laser chip of the laser component.

The heat sink may be formed by a metallization formed on the top side of the carrier. The metallization can be patterned lithography, for example. Via the first side surface of the laser chip, waste heat produced in the laser chip can flow away into the metallization on the top side of the carrier.

An electrically conductive material may be arranged on a top side of the carrier. The electrically conductive material has a depression. The underside of the laser chip is arranged on the base of the depression. The first side surface thermally conductively connects to a side wall of the depression. Advantageously, in this laser component, waste heat produced in the laser chip can flow away via the first side surface of the laser chip into the side wall of the depression on the top side of the carrier.

The above-described properties, features and advantages and the way in which they are achieved will become clearer and more clearly understood in association with the following description of the examples explained in greater detail in association with the drawings.

FIG. 1 shows a schematic perspective illustration of part of a first laser component 100. The first laser component 100 can be a high-power laser component, for example.

The first laser component 100 comprises a laser chip 1000. The laser chip 1000 is a semiconductor-based laser diode. The laser chip 1000 has a top side 1001 and an underside 1002 situated opposite the top side 1001. Furthermore, the laser chip 1000 has a first side surface 1003 and a second side surface 1004 situated opposite the first side surface 1003. The top side 1001, the underside 1002, the first side surface 1003 and the second side surface 1004 of the laser chip 1000 are oriented parallel to a resonator 1030 of the laser chip 1000. Furthermore, the laser chip 1000 has a first end side 1005 and a second end side 1006 situated opposite the first end side 1005. The first end side 1005 and the second end side 1006 are oriented perpendicular to the resonator 1030 of the laser chip 1000. The first end side 1005 and the second end side 1006 of the laser chip 1000 form mirror surfaces of the laser chip 1000. An emission region 1040 of the laser chip 1000 is arranged on the first end side 1005. The laser chip 1000 is thus an edge emitter.

A first electrical contact pad 1010 of the laser chip 1000 is formed on the top side 1001 of the laser chip 1000. A second electrical contact pad 1020 of the laser chip 1000 is formed on the underside 1002 of the laser chip 1000. Between the first electrical contact pad 1010 and the second electrical contact pad 1020 of the laser chip 1000, an electrical voltage can be applied to the laser chip 1000. If a suitable electrical voltage is applied to the laser chip 1000, then the laser chip 1000 emits a laser beam in the emission region 1040 on its first end side 1005, the laser beam being oriented approximately perpendicular to the first end side 1005.

The laser chip 1000 has a p-doped region and an n-doped region. The p-doped region of the laser chip 1000 can be arranged, for example, in a manner adjoining the top side 1001 of the laser chip 1000. In this case, the n-doped region of the laser chip 1000 is arranged in a manner adjoining the underside 1002 of the laser chip 1000. However, conversely, the p-doped region can also be adjacent to the underside 1002 of the laser chip 1000 and the n-doped region can also be adjacent to the top side 1001 of the laser chip 1000.

An active region of the laser chip 1000 is formed at a boundary between the n-doped region and the p-doped region of the laser chip 1000. The active region of the laser chip 1000 leads into the emission region 1040 of the laser chip 1000 on the first end side 1005. The active region and thus also the emission region 1040 can be arranged nearer to the top side 1001 than to the underside 1002 of the laser chip 1000. This is the case in the example illustrated in FIG. 1. However, the active region can also be arranged nearer to the underside 1002 than to the top side 1001 of the laser chip 1000.

The laser chip 1000 of the first laser component 100 is arranged on a top side 111 of a first carrier 110. The first carrier 110 can also be referred to as a submount. The first carrier 110 can comprise an electrically insulating material having good thermal conductivity. By way of example, the first carrier 110 can comprise a ceramic material. The first carrier 110 can comprise aluminum nitride (AlN), for example.

The laser chip 1000 is arranged on the top side 111 of the first carrier 110 such that the underside 1002 of the laser chip 1000 faces the top side 111 of the first carrier 110. The laser chip 1000 can be fixed to the top side 111 of the first carrier 110 by a hard solder, for example.

An electrical mating contact pad is formed on the top side 111 of the first carrier 110. The electrical mating contact pad electrically conductively connects to the second electrical contact pad 1020 of the laser chip 1000, the second electrical contact pad being arranged on the underside 1002 of the laser chip 1000. As a result, electrical voltage and electric current can be applied to the laser chip 1000 via the mating contact pad arranged on the top side 111 of the first carrier 110.

The first electrical contact pad 1010 of the laser chip 1000, the first electrical contact pad being formed on the top side 1001 of the laser chip 1000, can electrically conductively connect to a further mating contact pad of the first laser component 100 by a bond wire (not illustrated in FIG. 1) or some other electrically conductive element. The further mating contact pad can likewise be arranged on the top side 111 of the first carrier 110 or at a different location of the first laser component 100.

During operation of the first laser component 100, waste heat arises in the laser chip 1000 of the first laser component 100, which waste heat must be dissipated from the laser chip 1000 to prevent excessive heating and possible damage or destruction of the laser chip 1000. The waste heat is generated in the laser chip 1000 substantially in the active region near the top side 1001 of the laser chip 1000.

Via the contact between the underside 1002 of the laser chip 1000 and the top side 111 of the first carrier 110 of the first laser component 100, waste heat from the laser chip 1000 can flow away into the first carrier 110. However, the waste heat generated in the active region near the top side 1001 of the laser chip 1000 has to overcome a long path here through the laser chip 1000 associated with a high thermal resistance. As a result, the maximum heat power that can be dissipated from the laser chip 1000 via the underside 1002 is limited. A maximum optical output power with which the laser chip 1000 of the first laser component 100 can be operated is also limited as a result.

The first laser component 100 comprises a first heat sink 120 to increase the waste-heat power that can maximally be dissipated from the laser chip 1000 of the first laser component 100. The first heat sink 120 also dissipates waste heat from the laser chip 1000 through the first side surface 1003, the second side surface 1004, and the top side 1001 of the laser chip 1000. Waste heat transported from the laser chip 1000 into the first heat sink 120 can then flow away from the first heat sink 120, for example, into the first carrier 110 of the first laser component 100 and/or be emitted from the first heat sink 120 to surroundings of the first laser component 100.

The first heat sink 120 is formed by an electrically insulating material at least partly covering the first side surface 1003, the second side surface 1004 and the top side 1001 of the laser chip 1000. The electrically insulating material of the first heat sink 120 can comprise, for example, a ceramic, for example, aluminum nitride (AlN). The electrically insulating material of the first heat sink 120 can be in the form of granules. The electrically insulating material of the first heat sink 120 may have been applied to the first side surface 1003, the second side surface 1004 and the top side 1001 of the laser chip 1000 in the form a paste, for example. The material of the first heat sink 120 may, after application, also have been subjected to an additional processing step for hardening, for example, thermal hardening. A bond wire connected to the first electrical contact pad 1010 of the laser chip 1000 can be embedded into the material of the first heat sink 120. The electrically insulating material of the first heat sink 120 can also cover only the first side surface 1003.

Further laser components are described below with reference to FIGS. 2 to 8. These further laser components comprise a laser chip like the laser chip 1000 of the first laser component 100. Therefore, the laser chips of the further laser components are provided with the same reference signs as the laser chip 1000 of the first laser component 100 and will not be described in detail again below.

Figure 2:
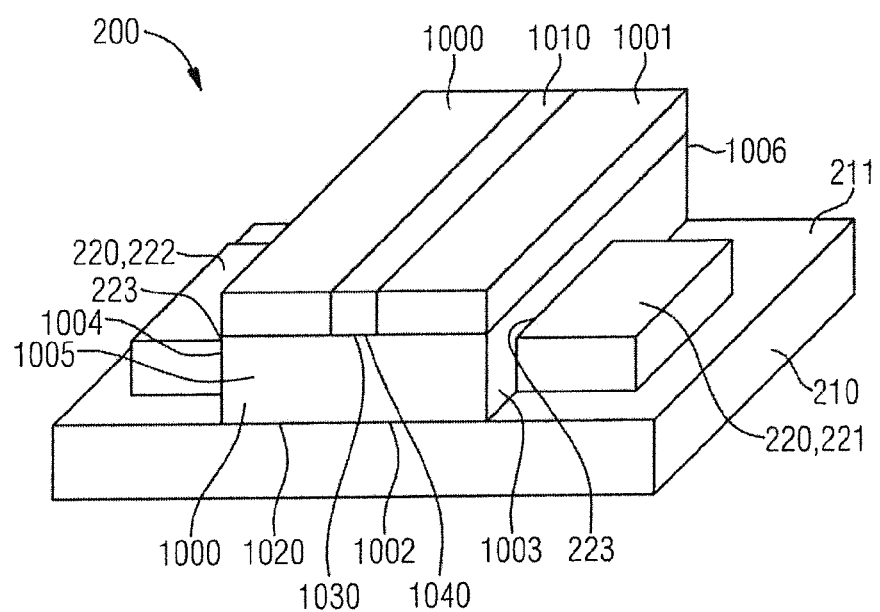
FIG. 2 shows a second laser component.

FIG. 2 shows a schematic perspective illustration of part of a second laser component 200. The second laser component 200 comprises a second carrier 210 having a top side 211. The second carrier 210 can comprise an electrically insulating material, for example, a ceramic material such as aluminum nitride (AlN).

The laser chip 1000 of the second laser component 200 is arranged on the top side 211 of the second carrier 210 such that the underside 1002 of the laser chip 1000 faces the top side 211 of the second carrier 210. The laser chip 1000 can be fixed to the top side 211 of the second carrier 210 by a hard solder, for example. The second electrical contact pad 1020 formed on the underside 1002 of the laser chip 1000 electrically conductively connects to an electrical mating contact pad arranged on the top side 211 of the second carrier 210. The first electrical contact pad 1010 of the laser chip 1000, the first electrical contact pad being formed on the top side 1001 of the laser chip 1000, can in turn electrically conductively connect to a further electrical mating contact pad of the second laser component 200 by a bond wire (not illustrated in FIG. 2) or some other conductive element.

The second laser component 200 comprises a second heat sink 220 that dissipates waste heat arising in the laser chip 1000 during operation of the second laser component 200 from the laser chip 1000 via the first side surface 1003 and the second side surface 1004. The second heat sink 220 comprises a first parallelepiped 221 and a second parallelepiped 222. The first parallelepiped 221 and the second parallelepiped 222 of the second heat sink 220 can comprise an electrically insulating material or an electrically conductive material. Preferably, the parallelepipeds 221, 222 of the second heat sink 220 comprise a material having good thermal conductivity. By way of example, the parallelepipeds 221, 222 of the second heat sink 220 can comprise copper or a ceramic such as aluminum nitride (AlN).

The first parallelepiped 221 of the second heat sink 220 is fixed to the first side surface 1003 of the laser chip 1000 by a soft solder 223. The second parallelepiped 222 is fixed to the second side surface 1004 of the laser chip 1000 by a soft solder 223. In addition, the first parallelepiped 221 and the second parallelepiped 222 can also be fixed to the top side 211 of the second carrier 210 by a soft solder. As a result, waste heat flowing away from the laser chip 1000 into the parallelepipeds 221, 222 of the second heat sink 220 via the side surfaces 1003, 1004 of the laser chip 1000 can flow away further into the second carrier 210. One of the parallelepipeds 221, 222 of the second heat sink 220 can also be omitted.

Figure 3:
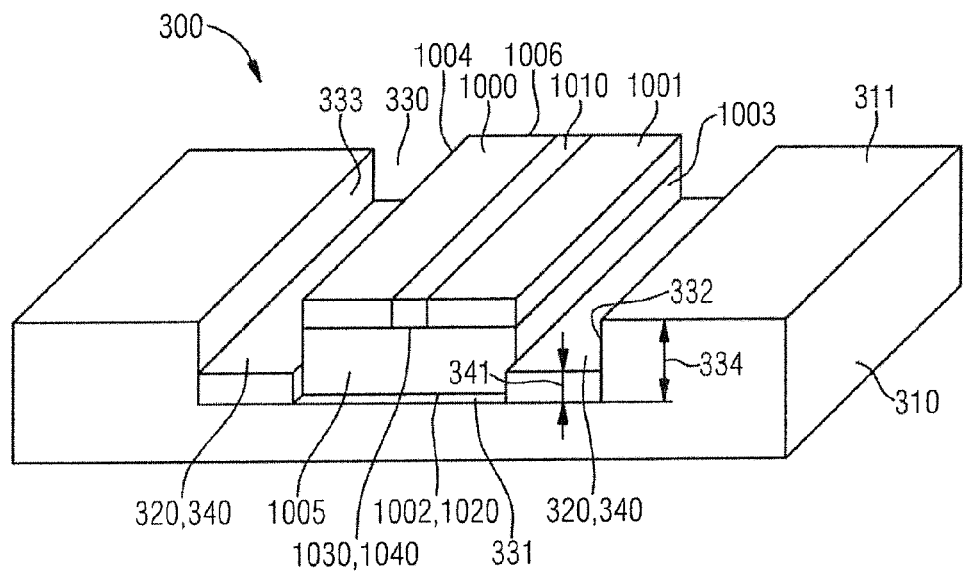
FIG. 3 shows a third laser component.

FIG. 3 shows a schematic perspective illustration of a part of third laser component 300. The third laser component 300 comprises a third carrier 310 having a top side 311. The third carrier 310 can comprise an electrically insulating material having good thermal conductivity, for example, a ceramic material such as aluminum nitride (AlN).

A depression 330 is formed on the top side 311 of the third carrier 310. The depression 330 extends into the third carrier 310 over a depth 334. The depth 334 can be 10 µm to 200 µm, for example. Preferably, the depth 334 of the depression 330 is 30 µm to 70 µm. By way of example, the depression 330 can have a depth 334 of 50 µm.

At the base of the depression 330, the latter has a bottom 331. The shape of the opening of the depression 330 on the top side 311 of the third carrier 310 can correspond to the shape of the underside 1002 of the laser chip 1000 of the third laser component 300, but has a larger area.

The laser chip 1000 of the third laser component 300 is arranged on the bottom 331 of the depression 330 of the third carrier 310 such that the underside 1002 of the laser chip 1000 faces the bottom 331 of the depression 330. A first side wall 332 of the depression 330 is situated opposite the first side surface 1003 of the laser chip 1000. A second side wall 333 of the depression 330 of the third carrier 310 is situated opposite the second side surface 1004 of the laser chip 1000. The laser chip 1000 can have a height of 120 µm, for example, between its underside 1002 and its top side 1001.

The second electrical contact pad 1020 formed on the underside 1002 of the laser chip 1000 electrically conductively connects to an electrical mating contact pad formed on the third carrier 310. The first electrical contact pad 1010 of the laser chip 1000, the first electrical contact pad being formed on the top side 1001, also electrically conductively connects to a further mating contact pad of the third laser component 300, for example, by a bond wire (not visible in FIG. 3).

A region of the depression 330 located between the first side surface 1003 of the laser chip 1000 and the first side wall 332 of the depression 330 and also a region of the depression 330 located between the second side surface 1004 of the laser chip 1000 and the second side wall 333 of the depression 330 are at least partly filled with a filling material 340. The filling material 340 is arranged above the bottom 331 of the depression 330 and has a height 341 above the bottom 331 of the depression 330. The height 341 of the filling material 340 can be smaller than the depth 334 of the depression 330. In that case, the filling material 340 does not completely fill the depression 330. By way of example, the height 341 of the filling material 340 can be 10 μm to 150 μm. Preferably, the filling material 340 has a height 341 of 10 μm to 70 μm.

The filling material 340 forms a third heat sink 320 of the third laser component 300. Via the filling material 340, waste heat arising in the laser chip 1000 of the third laser component 300 during operation of the third laser component 300 can be dissipated via the first side surface 1003 and the second side surface 1004 of the laser chip 1000.

The filling material 340 preferably comprises a material having good thermal conductivity. By way of example, the filling material can comprise a solder, aluminum nitride (AlN) or copper. If the filling material 340 is formed by solder, then the solder can also fix the laser chip 1000 to the bottom 331 of the depression 330 of the third carrier 310 of the third laser component 300. In this case, the depression 330 can first be filled with a thick solder layer during production of the third laser component 300, the laser chip 1000 partly sinking into the solder layer. However, the process of filling the depression 330 with the filling material 340 can also take place only after the process of arranging the laser chip 1000 in the depression 330 of the third carrier 310.

Figure 4:
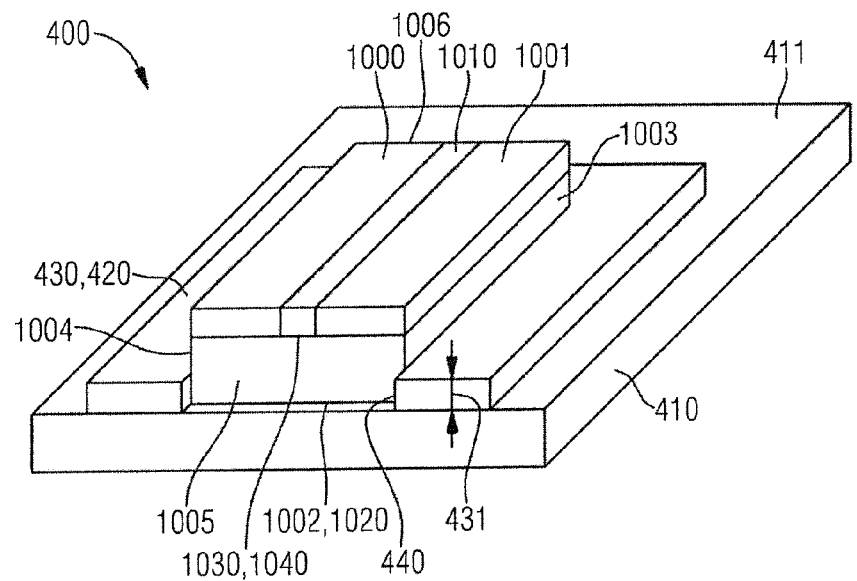
FIG. 4 shows a fourth laser component.

FIG. 4 shows a schematic perspective illustration of part of a fourth laser component 400. The fourth laser component 400 comprises a fourth carrier 410 having a top side 411. The fourth carrier 410 comprises an electrically insulating material having good thermal conductivity, for example, a ceramic such as aluminum nitride (AlN). In addition, the fourth carrier 410 has a metallization 430 having a thickness 431 at its top side 411. The thickness 431 of the metallization 430 is preferably 10 μm to 100 μm, particularly preferably 30 μm to 70 μm. By way of example, the metallization 430 can have a thickness 431 of 50 μm. The metallization 430 can comprise copper, for example.

The metallization 430 on the top side 411 of the fourth carrier 410 is lithography patterned to shape a fourth heat sink 420. Parts of the metallization 430 were removed by the lithographic patterning. In particular, a cutout 440 was created, the dimensions of which correspond approximately to the dimensions of the underside 1002 of the laser chip 1000 of the fourth laser component 400. Afterward, the laser chip 1000 was arranged in the cutout 440 on the top side 411 of the fourth carrier 410 such that the underside 1002 of the laser chip 1000 faces the top side 411 of the fourth carrier 410. The parts of the metallization 430 of the fourth carrier 410 that surround the cutout 440 are thereby adjacent to the first side surface 1003 and the second side surface 1004 of the laser chip 1000 and preferably bear on the first side surface 1003 and the second side surface 1004 of the laser chip 1000. The emission region 1040 remains free in this case. Between the side surfaces 1003, 1004 of the laser chip 1000 and the metallization 430, a solder can additionally also be arranged in the cutout 440. The fourth heat sink 420 formed by the metallization 430 in the vicinity of the cutout 440 dissipates waste heat arising in the laser chip 1000 during operation of the fourth laser component 400 from the laser chip 1000 via the first side surface 1003 and the second side surface 1004.

In the example of the fourth laser component 400 as shown in FIG. 4, a part of the fourth heat sink 420 formed by the metallization 430 in the vicinity of the cutout 440 also bears on the second end side 1006 of the laser chip 1000. As a result, waste heat produced in the laser chip 1000 can also flow away from the laser chip 1000 into the fourth heat sink 420 of the fourth laser component 400 via the second end side 1006. The fourth heat sink 420 formed by the metallization 430 in the vicinity of the cutout 440 could additionally also bear on the first end side 1005 of the laser chip 1000. However, the fourth heat sink 420 could also bear only on the first side surface 1003 of the laser chip 1000.

Figure 5:
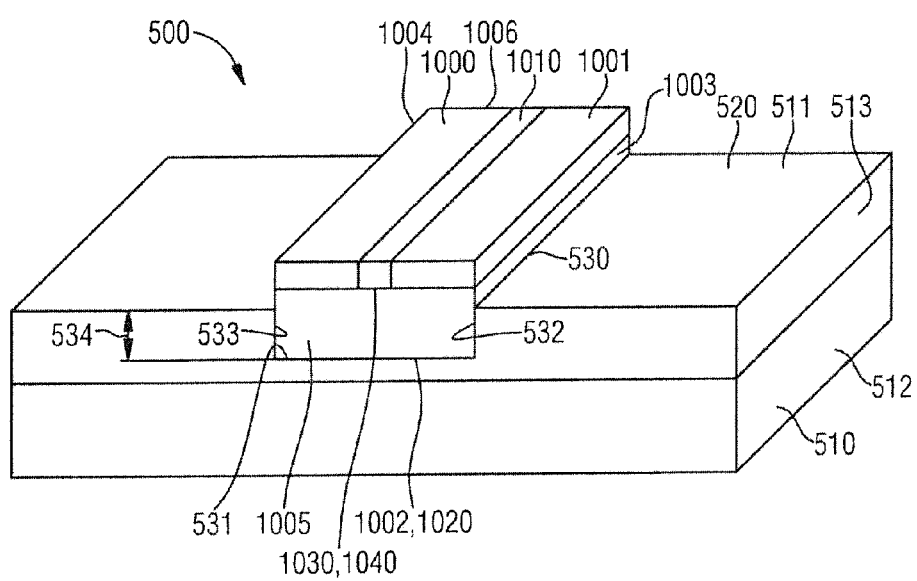
FIG. 5 shows a fifth laser component.

FIG. 5 shows a schematic perspective illustration of part of a fifth laser component 500. The fifth laser component 500 comprises a fifth carrier 510 having a top side 511. The fifth carrier 510 is a layer structure comprising an electrically insulating material 512 and an electrically conductive material 513 arranged above the insulating material 512. The electrically conductive material 513 forms the top side 511 of the fifth carrier 510. The electrically insulating material 512 can comprise, for example, a ceramic material such as aluminum nitride (AlN). The electrically conductive material 513 can comprise, for example, a metal such as copper. Preferably, both the electrically insulating material 512 and the electrically conductive material 513 of the fifth carrier 510 have a high thermal conductivity.

A depression 530 is formed on the top side 511 of the fifth carrier 510, the depression extending from the top side 511 of the fifth carrier 510 into the conductive material 513 of the fifth carrier 510. In this case, the depression 530 has a depth 534 smaller than the thickness of the layer of the conductive material 513. The depth 534 of the depression 530 can be 30 μm to 70 μm, for example. By way of example, the depression 530 can have a depth 534 of 50 μm. The layer of the conductive material 513 of the fifth carrier 510 can have a thickness of 100 μm, for example.

The depression 530 has a cross-sectional area whose shape and size correspond approximately to those of the underside 1002 of the laser chip 1000 of the fifth laser component 500. The laser chip 1000 of the fifth laser component 500 is arranged on a bottom 531 of the depression 530 such that the underside 1002 of the laser chip 1000 faces the bottom 531 of the depression 530. A first side wall 532 of the depression 530 faces the first side surface 1003 of the laser chip 1000. A second side wall 533 of the depression 530 faces the second side surface 1004 of the laser chip 1000. Preferably, the first side wall 532 and the second side wall 533 of the depression 530 bear on the first side surface 1003 and the second side surface 1004 of the laser chip 1000. However, a solder can also be arranged between the side walls 532, 533 of the depression 530 and the side surfaces 1003, 1004 of the laser chip 1000.

Waste heat arising in the laser chip 1000 during operation of the fifth laser component 500 can flow away via the first side surface 1003 and the second side surface 1004 of the laser chip 1000 and the side walls 532, 533 of the depression 530 into the conductive material 513 of the fifth carrier 510 of the fifth laser component 500. The conductive material 513 of the fifth carrier 510 thus forms a fifth heat sink 520 of the fifth laser component 500.

The second electrical contact pad 1020 formed on the underside 1002 of the laser chip 1000 electrically conductively connects to the conductive material 513 of the fifth carrier 510 of the fifth laser component 500, which thus forms an electrical mating contact pad. The first electrical contact pad 1010 formed on the top side 1001 of the laser chip 1000 of the fifth laser component 500 can electrically conductively connect to a further mating contact pad of the fifth laser component 500 by a bond wire or some other conductive element.

Figure 6:
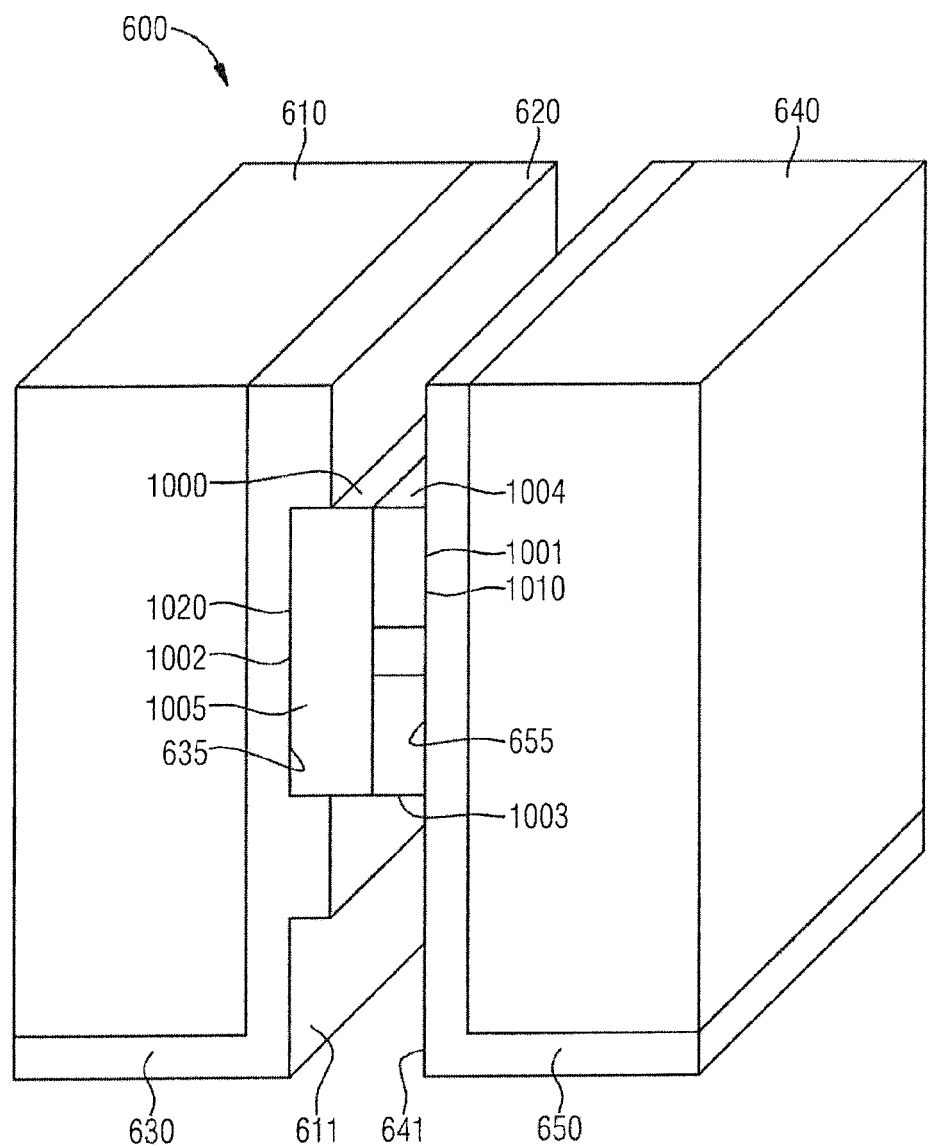
FIG. 6 shows a sixth laser component.

FIG. 6 shows a schematic illustration of part of a sixth laser component 600. The sixth laser component 600 comprises a sixth carrier 610 with a sixth heat sink 620 that dissipates waste heat arising in the laser chip 1000 of the sixth laser component 600 during operation of the sixth laser component 600 via the first side surface 1003 of the laser chip 1000. In the example shown in FIG. 6, the sixth carrier 610 with the sixth heat sink 620 is similar to the fifth carrier 510 of the fifth laser component 500. However, it is also possible for the sixth carrier 610 and the sixth heat sink 620 of the sixth laser component 600 to be similar to the second laser component 200, the third laser component 300 or the fourth laser component 400.

An electrically conductive material arranged on a top side 611 of the sixth carrier 610 of the sixth laser component 600 forms the sixth heat sink 620 and a first mating contact pad 635. The underside 1002 of the laser chip 1000 is arranged on the top side 611 of the sixth carrier 610 such that the second electrical contact pad 1020 formed on the underside 1002 of the laser chip 1000 electrically conductively connects to the first mating contact pad 635. The first mating contact pad 635 electrically conductively connects to a first soldering contact pad 630 arranged on an outer surface of the sixth carrier 610 perpendicular to the top side 611 of the sixth carrier 610.

The sixth laser component 600 comprises a further carrier 640 in addition to the sixth carrier 610. The further carrier 640 comprises an electrically insulating material having good thermal conductivity, for example, aluminum nitride (AlN). An electrically conductive layer forming a second mating contact pad 655 is arranged on a top side 641 of the further carrier 640. The second mating contact pad 655 electrically conductively connects to a second soldering contact pad 650 arranged on an outer surface of the further carrier 640 perpendicular to the top side 641 of the further carrier 640.

The further carrier 640 is arranged on the top side 1001 of the laser chip 1000 such that the first electrical contact pad 1010 of the laser chip 1000, the first electrical contact pad being formed on the top side 1001 of the laser chip 1000, electrically conductively connects to the second mating contact pad 655 of the further carrier 640. The sixth carrier 610 and the further carrier 640 of the sixth laser component 600 are arranged parallel to one another. The first soldering contact pad 630 and the second soldering contact pad 650 of the sixth laser component 600 are arranged alongside one another in a common plane. As a result, the sixth laser component 600 is suitable for surface mounting. In this case, the soldering contact pads 630, 650 of the sixth laser component 600 can be electrically contacted by reflow soldering, for example.

Waste heat arising in the laser chip 1000 of the sixth laser component 600 during operation of the sixth laser component 600 can flow away into the sixth carrier 610 via the underside 1002 of the laser chip 1000. In addition, waste heat arising in the laser chip 1000 can flow away via the first side surface 1003 and the second side surface 1004 of the laser chip 1000 into the sixth heat sink 620 of the sixth laser component 600. Moreover, waste heat arising in the laser chip 1000 can flow away via the top side 1001 of the laser chip 1000 into the further carrier 640. As a result, a high waste-heat power can be dissipated from the laser chip 1000 in the sixth laser component 600. This enables the sixth laser component 600 to be operated with high optical output power without overheating the laser chip 1000 of the sixth laser component 600 occurring.

Figure 7:
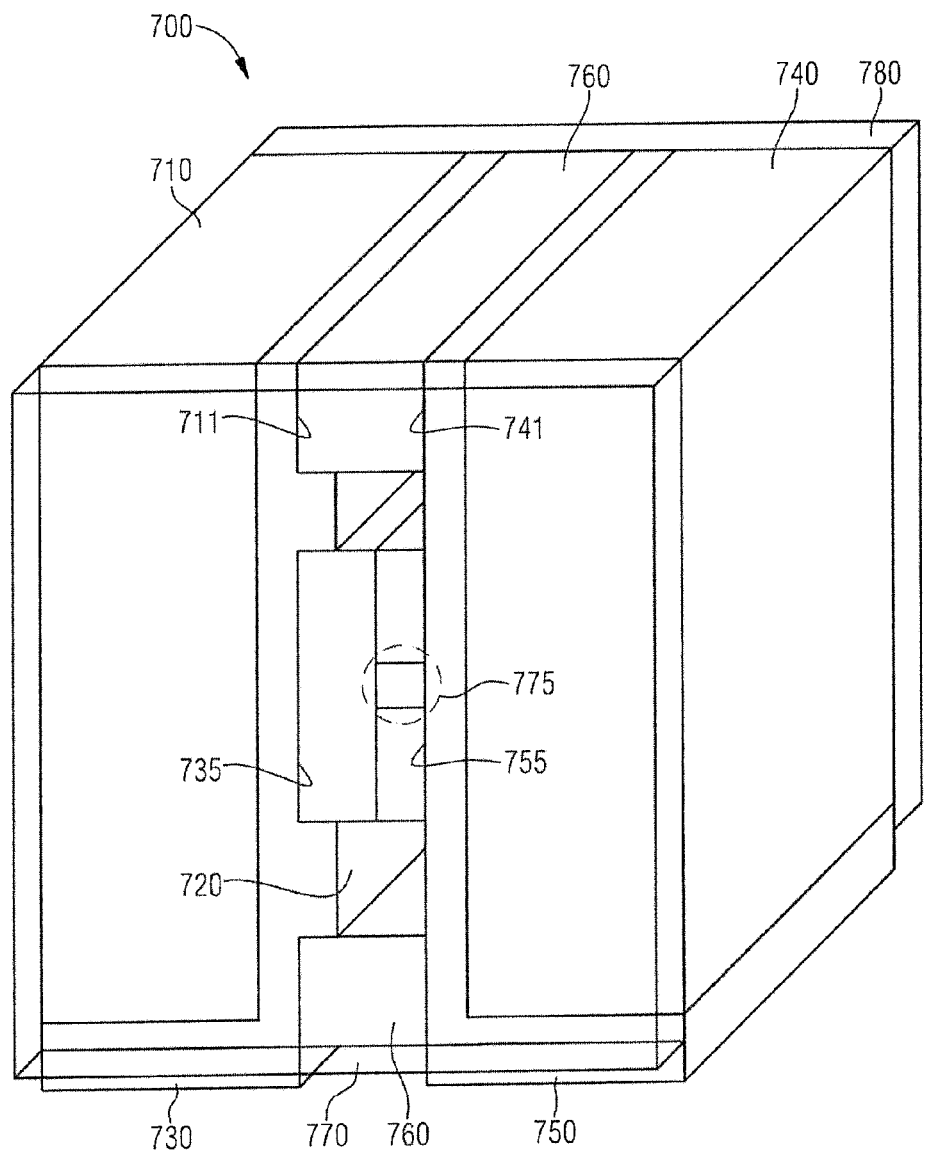
FIG. 7 shows a seventh laser component.

FIG. 7 shows a schematic perspective illustration of part of a seventh laser component 700. The seventh laser component 700 exhibits correspondences with the sixth laser component 600. In particular, the seventh laser component 700 comprises a seventh carrier 710, like the sixth carrier 610 of the sixth laser component 600. The seventh carrier 710 has a top side 711. A seventh heat sink 720 is arranged on the top side 711 of the seventh carrier 710. A first mating contact pad 735 arranged on the top side 711 of the seventh carrier 710 electrically conductively connects to a first soldering contact pad 730 arranged on an outer surface of the seventh carrier 710 perpendicular to the top side 711 of the seventh carrier 710.

The laser chip 1000 is arranged on the top side 711 of the seventh carrier 710 such that the underside 1002 of the laser chip 1000 faces the top side 711 of the seventh carrier 710 and the second electrical contact pad 1020 of the laser chip 1000, the second electrical contact pad being formed on the underside 1002 electrically conductively connects to the first mating contact pad 735. The first side surface 1003 and the second side surface 1004 of the laser chip 1000 of the seventh laser component 700 are additionally in thermal contact with the seventh heat sink 720.

The seventh laser component 700 furthermore comprises a further carrier 740 like the further carrier 640 of the sixth laser component 600. A second mating contact pad 755 is arranged on a top side 741 of the further carrier 740, the second mating contact pad electrically conductively connected to a second soldering contact pad 750 arranged on an outer surface of the further carrier 740 perpendicular to the top side 741. The further carrier 740 is arranged on the top side 1001 of the laser chip 1000 such that the first electrical contact pad 1010 of the laser chip 1000, the first electrical contact pad being formed on the top side 1001 of the laser chip 1000, electrically conductively connects to the second mating contact pad 755.

In contrast to the sixth laser component 600, the laser chip 1000 is hermetically tightly encapsulated in the seventh laser component 700. For this purpose, the seventh laser component 700 comprises two spacers 760 arranged between the top side 711 of the seventh carrier 710 and the top side 741 of the further carrier 740. In this case, the spacers 760 extend parallel to the side surfaces 1003, 1004 of the laser chip 1000. Furthermore, the seventh laser component 700 comprises a front cover glass 770 and a rear cover glass 780. The front cover glass 770 covers the laser chip 1000 and the surroundings of the laser chip 1000 on the first end side 1005 of the laser chip 1000. The rear cover glass 780 covers the laser chip 1000 and the surroundings of the laser chip 1000 on the second end side 1006 of the laser chip 1000. Overall, the laser chip 1000 of the seventh laser component 700 is thus completely hermetically tightly enclosed by the seventh carrier 710, the further carrier 740, the two spacers 760, the front cover glass 770 and the rear cover glass 780.

The seventh laser component 700 is also suitable for surface mounting. In this case, the soldering contact pads 730, 750 of the seventh laser component 700 can be electrically contacted by reflow soldering, for example.

The front cover glass 770 of the seventh laser component 700 comprises a material substantially transmissive to a laser beam emitted by the laser chip 1000 of the seventh laser component 700. The front cover glass 770 can additionally comprise an integrated optical lens 775 arranged in front of the emission region 1040 of the laser chip 1000. The integrated optical lens 775 can be a collimating lens or a diverging lens, for example. However, the optical lens 775 can also be omitted. The rear cover glass 780 can comprise a transparent material or an opaque material. The rear cover glass 780 can also be omitted.

Figure 8:
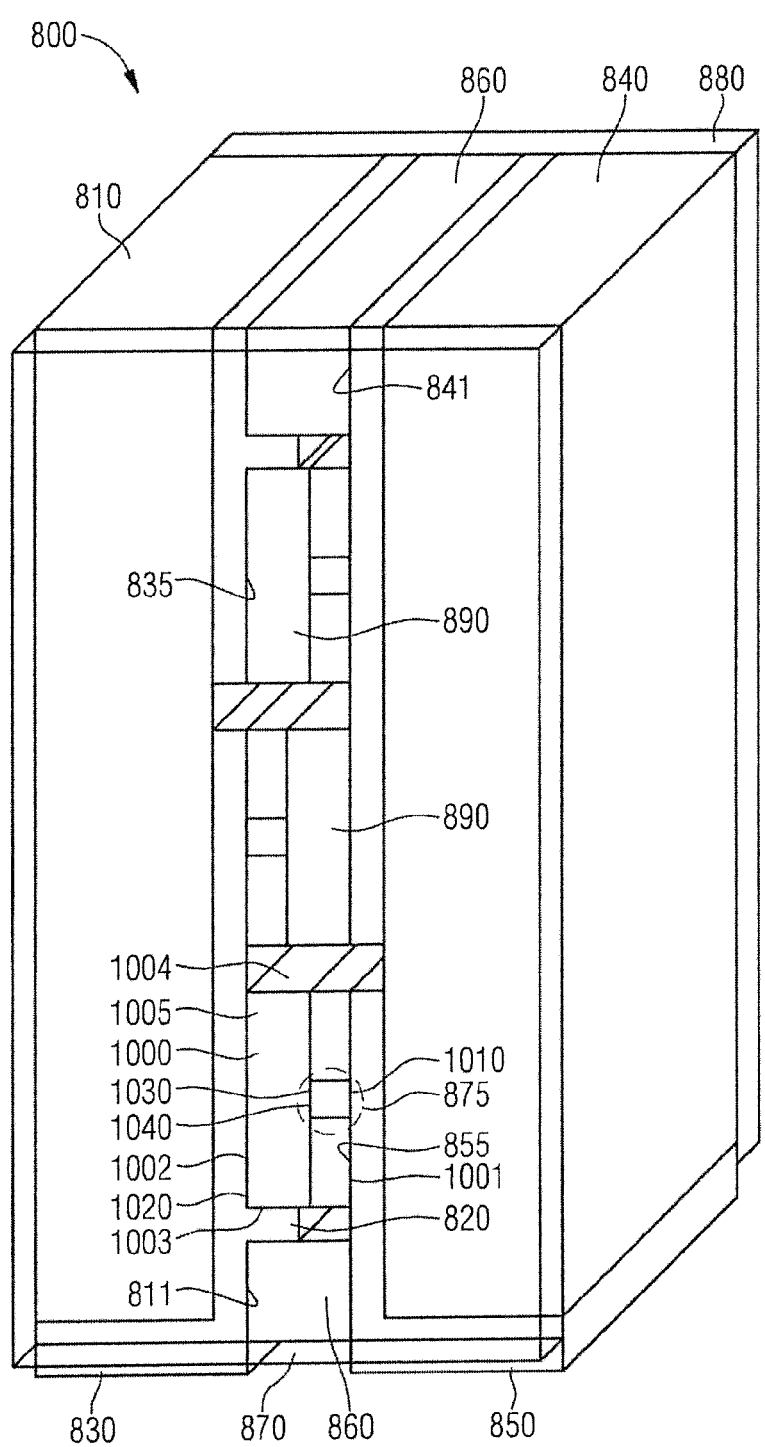
FIG. 8 shows an eighth laser component.

FIG. 8 shows a schematic perspective illustration of part of an eight laser component 800. The eighth laser component 800 exhibits correspondences with the seventh laser component 700 from FIG. 7. However, the eighth laser component 800 additionally comprises two further laser chips 890 besides the laser chip 1000. The further laser chips 890 can be like the laser chip 1000.

The eighth laser component 800 comprises an eighth carrier 810 having a top side 811. An eighth heat sink 820 is formed on the top side 811. Moreover, a first mating contact pad 835 is arranged on the top side 811 of the eighth carrier 810, the first mating contact pad electrically conductively connected to a first soldering contact pad 830. The first soldering contact pad 830 is arranged on an outer surface of the eighth carrier 810 perpendicular to the top side 811.

The eighth laser component 800 furthermore comprises a further carrier 840 having a top side 841. A second mating contact pad 855 is arranged on the top side 841 of the further carrier 840. The second mating contact pad 855 electrically conductively connects to a second soldering contact pad 850 arranged on an outer surface of the further carrier 840 perpendicular to the top side 841 of the further carrier 840.

The laser chip 1000 of the eighth laser component 800 is arranged between the top side 811 of the eighth carrier 810 and the top side 841 of the further carrier 840 such that the underside 1002 of the laser chip 1000 faces the top side 811 of the eighth carrier 810 and the top side 1001 of the laser chip 1000 faces the top side 841 of the further carrier 840. The second electrical contact pad 1020 of the laser chip 1000, the second electrical contact pad being formed on the underside 1002, electrically conductively connects to the first mating contact pad 835 on the top side 811 of the eighth carrier 810. The first electrical contact pad 1010 of the laser chip 1000, the first electrical contact pad being formed on the top side 1001, electrically conductively connects to the second mating contact pad 855 on the top side 841 of the further carrier 840. The first side surface 1003 of the laser chip 1000 is in thermal contact with the eighth heat sink 820 of the eighth carrier 810 of the eighth laser component 800.

The further laser chips 890 are likewise arranged between the eighth carrier 810 and the further carrier 840 of the eighth laser component 800. In this case, the laser chip 1000 and the further laser chips 890 of the eighth laser component 800 electrically connect in series between the first soldering contact pad 830 and the second soldering contact pad 850 of the eighth laser component 800. A parallel connection or an interconnection in opposite directions is also possible. Side surfaces of the further laser chips 890 preferably thermally contact further heat sinks of the eighth laser component 800 to dissipate waste heat arising in the further laser chips 890 via the side surfaces of the further laser chips 890.

The laser chip 1000 and the further laser chips 890 of the eighth laser component 800 are hermetically tightly enclosed. For this purpose, two spacers 860 are arranged between the eighth carrier 810 and the further carrier 840, the spacers extending parallel to the side surfaces of the laser chips 1000, 890 of the eighth laser component 800. Moreover, the laser chips 1000, 890 of the eighth laser component 800 are encapsulated by a front cover glass 870 and a rear cover glass 880. The front cover glass 870 is arranged in front of the first end side 1005 of the laser chip 1000 and the first end sides of the further laser chips 890. The rear cover glass 880 is arranged in front of the second end side 1006 of the laser chip 1000 and the second end sides of the further laser chips 890. The eighth carrier 810, the further carrier 840, the spacers 860, the front cover glass 870 and the rear cover glass 880 encapsulate the laser chip 1000 and the further laser chips 890 hermetically tightly.

The front cover glass 870 comprises a material substantially transmissive to laser beams emitted by the laser chip 1000 and the further laser chips 890. The front cover glass 870 can comprise an optical lens 875 arranged in front of the emission region 1040 of the laser chip 1000. Moreover, the front cover glass 870 can comprise further integrated optical lenses arranged in front of the emission regions of the further laser chips 890. An integrated optical lens can also be provided jointly for all the laser chips. However, the optical lens 775, 875 can also be omitted. The rear cover glass 880 can comprise a transparent material or an opaque material. The rear cover glass 880 can also be omitted.

Our laser diodes have been illustrated and described in greater detail on the basis of the preferred examples. Nevertheless, this disclosure is not restricted to the examples disclosed. Rather, other variations can be derived therefrom by those skilled in the art, without departing from the scope of protection of the appended claims.

This application claims priority of DE 10 2013 216 526.9, the disclosure of which is hereby incorporated by reference.

The invention claimed is:

1. A laser component comprising a laser chip having a top side, an underside, a first side surface and a second side surface, which are oriented parallel to a resonator of the laser chip,
    wherein the underside of the laser chip is arranged in a manner bearing on a carrier,
    the top side of the laser chip is arranged in a manner bearing on a further carrier,
    the laser chip is hermetically tightly encapsulated between the carrier and the further carrier,
    a second electrical contact pad of the laser chip, said second electrical contact pad being formed on the top side of the laser chip, electrically conductively connects to a second electrical mating contact pad formed on the further carrier, and
    the first side surface of the laser chip thermally conductively connects to a heat sink.

2. The laser component as claimed in claim 1, wherein a respective soldering contact pad that electrically contacts the laser component is arranged on the carrier and on the further carrier.

3. The laser component as claimed in claim 1, wherein the laser component comprises a cover glass arranged in front of a radiation emission face of the laser chip.

4. The laser component as claimed in claim 3, wherein the cover glass comprises an integrated optical lens.

5. The laser component as claimed in claim 1, wherein a first electrical contact pad of the laser chip, said first electrical contact pad being formed on the underside of the laser chip, electrically conductively connects to a first electrical mating contact pad, which is formed on the carrier.

6. The laser component as claimed in claim 1, wherein the laser component comprises a further laser chip.

7. The laser component as claimed in claim 1, wherein the heat sink comprises an electrically insulating material bearing on at least one part of the first side surface of the laser chip.

8. The laser component as claimed in claim 7, wherein the electrically insulating material comprises AlN.

9. The laser component as claimed in claim 7, wherein the electrically insulating material comprises granules.

10. The laser component as claimed in claim 7, wherein the electrically insulating material also bears on at least one part of the second side surface and one part of the top side of the laser chip.

11. The laser component as claimed in claim 1, wherein the heat sink is fixed to the first side surface by a soft solder.

12. The laser component as claimed in claim 1,
wherein a depression is formed on a top side of the carrier,
the underside of the laser chip is arranged on the base of the depression, and
a region of the depression surrounding the laser chip is at least partly filled with a filling material.

13. The laser component as claimed in claim 12, wherein the filling material comprises a solder, AlN or Cu.

14. The laser component as claimed in claim 12,
wherein the depression has a depth of 10 µm to 200 µm, and
the filling material above the base of the depression has a height of 10 µm to 150 µm.

15. The laser component as claimed in claim 1, wherein the heat sink is formed by a metallization formed on the top side of the carrier.

16. The laser component as claimed in claim 1,
wherein an electrically conductive material is arranged on a top side of the carrier,
the electrically conductive material has a depression,
the underside of the laser chip is arranged on the base of the depression, and
the first side surface thermally conductively connects to a side wall of the depression.

* * * * *